(12) United States Patent
Guo et al.

(10) Patent No.: US 11,797,195 B2
(45) Date of Patent: *Oct. 24, 2023

(54) DYNAMIC PEAK POWER MANAGEMENT FOR MULTI-DIE OPERATIONS

(71) Applicant: Yangtze Memory Technologies Co., Ltd., Hubei (CN)

(72) Inventors: Jason Guo, Hubei (CN); Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/864,850

(22) Filed: Jul. 14, 2022

(65) Prior Publication Data
US 2022/0350505 A1 Nov. 3, 2022

Related U.S. Application Data

(63) Continuation of application No. 17/127,405, filed on Dec. 18, 2020, now Pat. No. 11,467,741, which is a
(Continued)

(51) Int. Cl.
*G11C 5/14* (2006.01)
*G06F 3/06* (2006.01)
(Continued)

(52) U.S. Cl.
CPC .......... *G06F 3/0625* (2013.01); *G06F 3/0629* (2013.01); *G06F 3/0679* (2013.01);
(Continued)

(58) Field of Classification Search
CPC .... G06F 3/0625; G06F 3/0629; G06F 3/0679; G11C 5/14; G11C 16/30; G11C 5/147;
(Continued)

(56) References Cited

U.S. PATENT DOCUMENTS 8,144,496 B2   3/2012 Cheng
8,159,853 B2   4/2012 Kim et al.
(Continued)

FOREIGN PATENT DOCUMENTS

CN   101800075 A   8/2010
CN   102483729 A   5/2012
(Continued)

OTHER PUBLICATIONS

International Search Report of the International Searching Authority directed to related International Patent Application No. PCT/CN2020/131692, dated Aug. 18, 2021; 5 pages.
(Continued)

*Primary Examiner* — Khamdan N. Alrobaie
(74) *Attorney, Agent, or Firm* — Sterne, Kessler, Goldstein & Fox P.L.L.C.

(57) ABSTRACT

A method of peak power management (PPM) for a storage system with multiple memory dies is provided, where each of the multiple memory dies includes a PPM circuit having a PPM contact pad and PPM contact pads of the multiple memory dies are electrically connected. The PPM method includes the following steps: switching on a pull-down driver of the PPM circuit on a selected memory die of the storage system; verifying a PPM enablement signal regulated by a pull-down current flowing through the pull-down driver; and performing a peak power operation on the selected memory die when the PPM enablement signal indicates that a total current of the storage system is less than a maximum total current allowed for the storage system.

21 Claims, 8 Drawing Sheets

Related U.S. Application Data continuation of application No. PCT/CN2020/131692, filed on Nov. 26, 2020.

(51) Int. Cl.
*G11C 16/30* (2006.01)
*H01L 27/06* (2006.01)

(52) U.S. Cl.
CPC ............... *G11C 5/14* (2013.01); *G11C 16/30* (2013.01); *H01L 27/0629* (2013.01)

(58) Field of Classification Search
CPC .. G11C 16/0483; G11C 16/06; H01L 27/0629
See application file for complete search history.

(56) References Cited

U.S. PATENT DOCUMENTS

| | | | |
|---|---|---|---|
| 9,377,804 B2 | 6/2016 | Coutts et al. | |
| 9,881,654 B2 | 1/2018 | Peng et al. | |
| 9,947,401 B1 | 4/2018 | Navon et al. | |
| 10,359,831 B2 | 7/2019 | Crawford et al. | |
| 10,365,703 B2 | 7/2019 | Ha et al. | |
| 2002/0630576 | 5/2002 | Kim et al. | |
| 2003/0093702 A1 | 5/2003 | Luo et al. | |
| 2012/0001642 A1 | 1/2012 | Sylvester et al. | |
| 2012/0063234 A1 | 3/2012 | Shiga et al. | |
| 2012/0176849 A1 | 7/2012 | Ko et al. | |
| 2013/0307611 A1 | 11/2013 | Kang et al. | |
| 2014/0029357 A1* | 1/2014 | Lee | G11C 16/30 365/189.11 |
| 2014/0063990 A1 | 3/2014 | Ku et al. | |
| 2014/0195734 A1 | 7/2014 | Ha et al. | |
| 2014/0286110 A1 | 9/2014 | Shimizu et al. | |
| 2014/0293704 A1 | 10/2014 | Ghalam et al. | |
| 2015/0235677 A1* | 8/2015 | Grunzke | G11C 5/04 365/226 |
| 2016/0162214 A1 | 6/2016 | McCall et al. | |
| 2016/0343441 A1 | 11/2016 | Abiko et al. | |
| 2017/0104406 A1 | 4/2017 | Kim et al. | |
| 2017/0194946 A1 | 7/2017 | Lee | |
| 2017/0256955 A1 | 9/2017 | Addepalli et al. | |
| 2019/0114099 A1 | 4/2019 | Jeon et al. | |
| 2019/0179553 A1 | 6/2019 | Kim et al. | |
| 2020/0279591 A1 | 9/2020 | Kim et al. | |
| 2020/0350026 A1 | 11/2020 | Piccardi et al. | |
| 2021/0373795 A1* | 12/2021 | Lee | G06F 3/0634 |
| 2022/0044710 A1 | 2/2022 | Tang | |
| 2022/0148663 A1 | 5/2022 | Guo | |
| 2022/0164117 A1 | 5/2022 | Guo et al. | |

FOREIGN PATENT DOCUMENTS

| | | |
|---|---|---|
| CN | 103617966 A | 3/2014 |
| CN | 105074832 A | 11/2015 |
| CN | 106170739 A | 11/2016 |
| CN | 112585682 A | 3/2021 |
| TW | 201631489 A | 9/2016 |
| TW | I 584297 B | 5/2017 |
| TW | 201805930 A | 2/2018 |

OTHER PUBLICATIONS

Chinese Application No. 202080003887.3, Office Action dated May 30, 2022; with attached English Language Translation from EPO Global Dossier; 19 pages.

* cited by examiner

DYNAMIC PEAK POWER MANAGEMENT FOR MULTI-DIE OPERATIONS

INCORPORATION BY REFERENCE

This application is a continuation of U.S. patent application Ser. No. 17/127,405 filed on Dec. 18, 2020 and titled "Dynamic Peak Power Management for Multi-die Operations," which claims priority to PCT/CN2020/131692 filed on Nov. 26, 2020, all of which are incorporated herein by reference in their entirety.

TECHNICAL FIELD

The present disclosure generally relates to the field of semiconductor technology, and more particularly, to circuit designs and methods for peak power management in a storage system.

BACKGROUND

In many servers and mobile devices, a NAND storage system is widely used as the primary non-volatile storage device due to its high storage density and relatively low access latency. However, performance of a high density storage system, for example, a three-dimensional (3D) NAND storage system, is often restricted by the maximum amount of power (or peak current) that it can use. Currently, operations consuming high power (i.e., peak power operations) that are carried out by various memory dies of the NAND storage system can be staggered by a system controller. Only a limited number of peak power operations can be performed simultaneously. This approach can also result in increased system loading with unnecessary over-management. Communications between different memory dies can be established to coordinate the peak power operations. Currently, coordination between two memory dies can be arranged and peak power operations can be staggered between these two memory dies. However, only one peak power operation can be performed at one time. In addition, two or more contact pads are used on each memory die for communications between different memory dies in the storage system. Therefore, it is necessary to optimize the peak power management circuits and scheme to coordinate between multiple memory dies such that multiple peak power operations can be performed in a storage system simultaneously. As such, the storage system's power or current budget can be fully utilized.

BRIEF SUMMARY

An aspect of the present disclosure is to provide effective peak power management for a memory storage system.

One aspect of the present disclosure provides a peak power management (PPM) system for a storage system with multiple memory dies. The PPM system includes a PPM circuit on each of the multiple memory dies. Each PPM circuit includes a pull-up driver electrically connected to a power source and a PPM resistor; a pull-down driver electrically connected to the PPM resistor; and a PPM contact pad connected to the PPM resistor. PPM contact pads of the multiple memory dies are electrically connected with each other. And the PPM system is configured to manage a peak power operation based on an electric potential of the PPM contact pads.

In some embodiments, the PPM system further includes a comparator with a first input terminal electrically connected to the PPM contact pads of the multiple memory dies and a second input terminal electrically connected to a reference voltage. In some embodiments, an output terminal of the comparator is connected to an inverter. In some embodiments, an RC filter is electrically connected to the PPM contact pads of the multiple memory dies and the first input terminal of the comparator. In some embodiments, the reference voltage is based on a maximum total current allowed in the storage system.

In some embodiments, the electric potential of the PPM contact pads is adjusted by a pull-down current flowing through the pull-down driver in the PPM circuit. In some embodiments, the pull-down current includes a high current level, the high current level corresponding to a peak current of the peak power operation.

In some embodiments, the pull-up driver includes a p-channel metal oxide semiconductor field effect transistor (MOSFET).

In some embodiments, the pull-down driver includes an n-channel metal oxide semiconductor field effect transistor (MOSFET).

In some embodiments, the PPM contact pad, the PPM resistor and the pull-down driver are electrically connected.

In some embodiments, the PPM contact pad, the PPM resistor and the pull-up driver are electrically connected.

In some embodiments, the PPM contact pads are electrically connected through die-to-die connections, each die-to-die connection including a metal interconnect.

In some embodiments, the PPM contact pads are electrically connected through flip-chip bonding, die-to-die bonding, or wire-bonding.

Another aspect of the present disclosure provides a method of peak power management (PPM) for a storage system with multiple memory dies, wherein each of the multiple memory dies includes a PPM circuit having a PPM contact pad. PPM contact pads of the multiple memory dies are electrically connected. The PPM method includes the following steps: switching on a pull-down driver of the PPM circuit on a selected memory die of the storage system; verifying a PPM enablement signal regulated by a pull-down current flowing through the pull-down driver; and performing a peak power operation on the selected memory die when the PPM enablement signal indicates that a total current of the storage system is less than a maximum total current allowed for the storage system.

In some embodiments, the method also includes, after switching on the pull-down driver, setting the pull-down current flowing through the pull-down driver on the selected memory die at a high current level, wherein the high current level correspond to a peak current of the peak power operation on the selected memory die.

In some embodiments, the method further includes, after performing the peak power operation, setting the pull-down current flowing through the pull-down driver on the selected memory die to a low current level, wherein the low current level correspond to a base current on the selected memory die.

In some embodiments, the method further includes switching off the pull-down driver on the selected memory die if the PPM enablement signal indicates that the total current of the storage system is more than the maximum total current allowed for the storage system.

In some embodiments, the method also includes, after switching off the pull-down driver, waiting for a delay time period.

In some embodiments, the method further includes, prior to verifying the PPM enablement signal, generating the PPM enablement signal by comparing a reference voltage with an electric potential of the PPM contact pads. The reference voltage is selected according to the maximum total current allowed for the storage system.

In some embodiments, the method also includes regulating the electric potential of the PPM contact pads through the pull-down current of the pull-down driver, wherein the total current of the storage system corresponds to a sum of the pull-down current flowing through each pull-down driver on the storage system.

In some embodiments, the PPM enablement signal is set to 0 if the electric potential of the PPM contact pads is higher than the reference voltage; and the PPM enablement signal is set to 1 if the electric potential of the PPM contact pads is lower than the reference voltage.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1B:
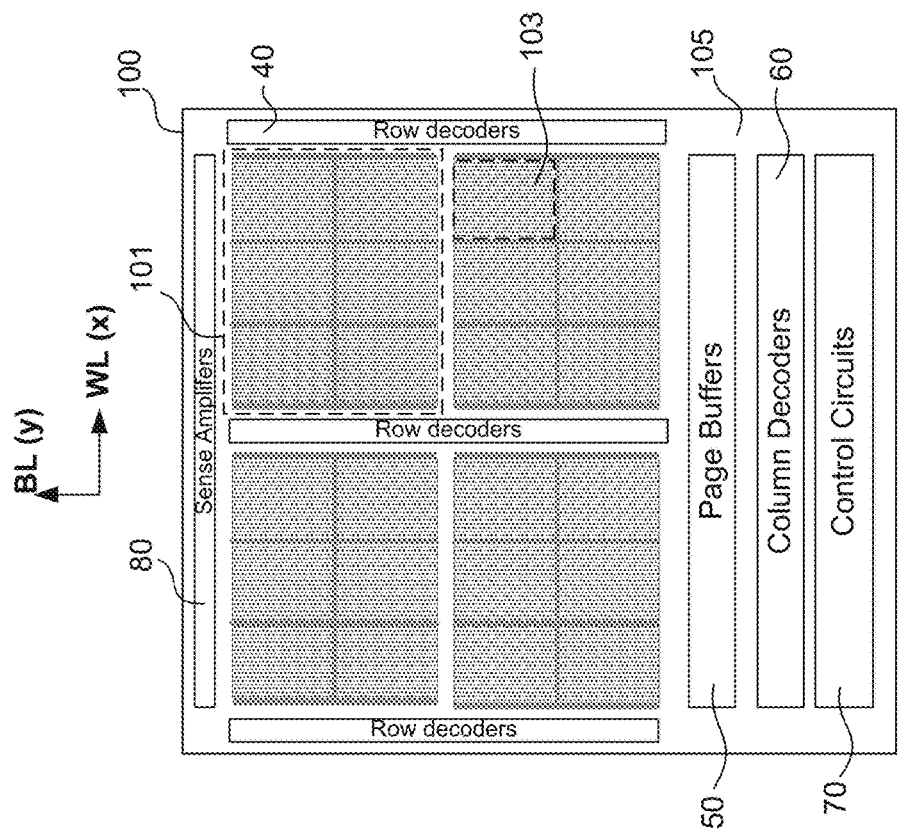
FIG. 1B illustrates a top-down view of a memory die, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Figure 1A:
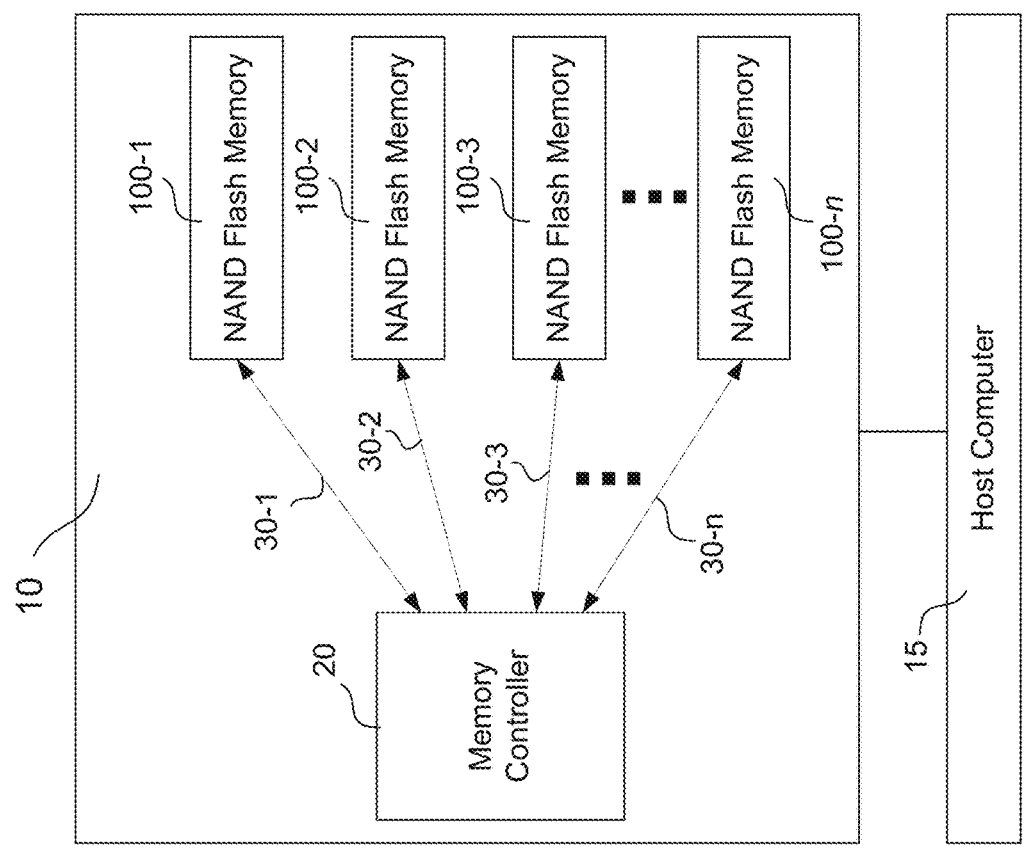
FIG. 1A illustrates a storage system with one or more NAND flash memories, according to some embodiments of the present disclosure.

FIG. 1A illustrates a storage system 10, according to some embodiments of the present disclosure. The storage system 10 (also referred to as a NAND storage system) can include a memory controller 20 and one or more NAND flash memories 100-1, 100-2, 100-3, . . . , 100-n (collectively referred to as NAND flash memories 100). The storage system 10 can communicate with a host computer 15 through the memory controller 20, where the memory controller 20 can be connected to the one or more NAND flash memories 100-1, 100-2, 100-3, . . . , 100-n, via one or more memory channels 30-1, 30-2, 30-3, . . . , 30-n (collectively referred to as memory channels 30). In some embodiments, each of the NAND flash memories 100 can be managed by the memory controller 20 via a memory channel 30.

The host computer 15 sends data to be stored at the storage system 10 or retrieves data by reading the storage system 10. The memory controller 20 can handle I/O requests received from the host computer 15, ensure data integrity and efficient storage, and manage the NAND flash memories 100. The memory channels 30 can provide data and control communication between the memory controller 20 and each of the NAND flash memories 100 via a data bus. The memory controller 20 can select one of the NAND flash memories 100 according to a chip enable signal.

FIG. 1B illustrates a top-down view of a NAND flash memory 100, according to some embodiments of the present disclosure. The NAND flash memory 100 can be a memory die (or a die) or any portion of a memory die. In some embodiments, each NAND flash memory 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1B, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1B. In this disclosure, one or more of the memory blocks 103 are also referred to as the "memory array" or "array." The memory array is the core area on a memory die, performing storage functions.

The NAND flash memory 100 also includes a periphery circuit region 105, an area surrounding memory planes 101. The periphery circuit region 105 contains peripheral circuits that include many digital, analog, and/or mixed-signal circuits to support functions of the memory array, for example, page buffers 50, row decoders 40, column decoders 60, control circuits 70 and sense amplifiers 80. Control circuits 70 include active and/or passive semiconductor devices, such as transistors, diodes, capacitors, resistors, etc., as would be apparent to a person of ordinary skill in the art.

It is noted that the layout of the electronic components in the storage system 10 and the NAND flash memory 100 in FIGS. 1A and 1B are shown as examples. The storage system 10 and the NAND flash memory 100 can have other layout and can include additional components. For example, the NAND flash memory 100 can also have high-voltage charge pumps, I/O circuits, etc. The storage system 10 can also include firmware, data scrambler, etc.

Figure 2:
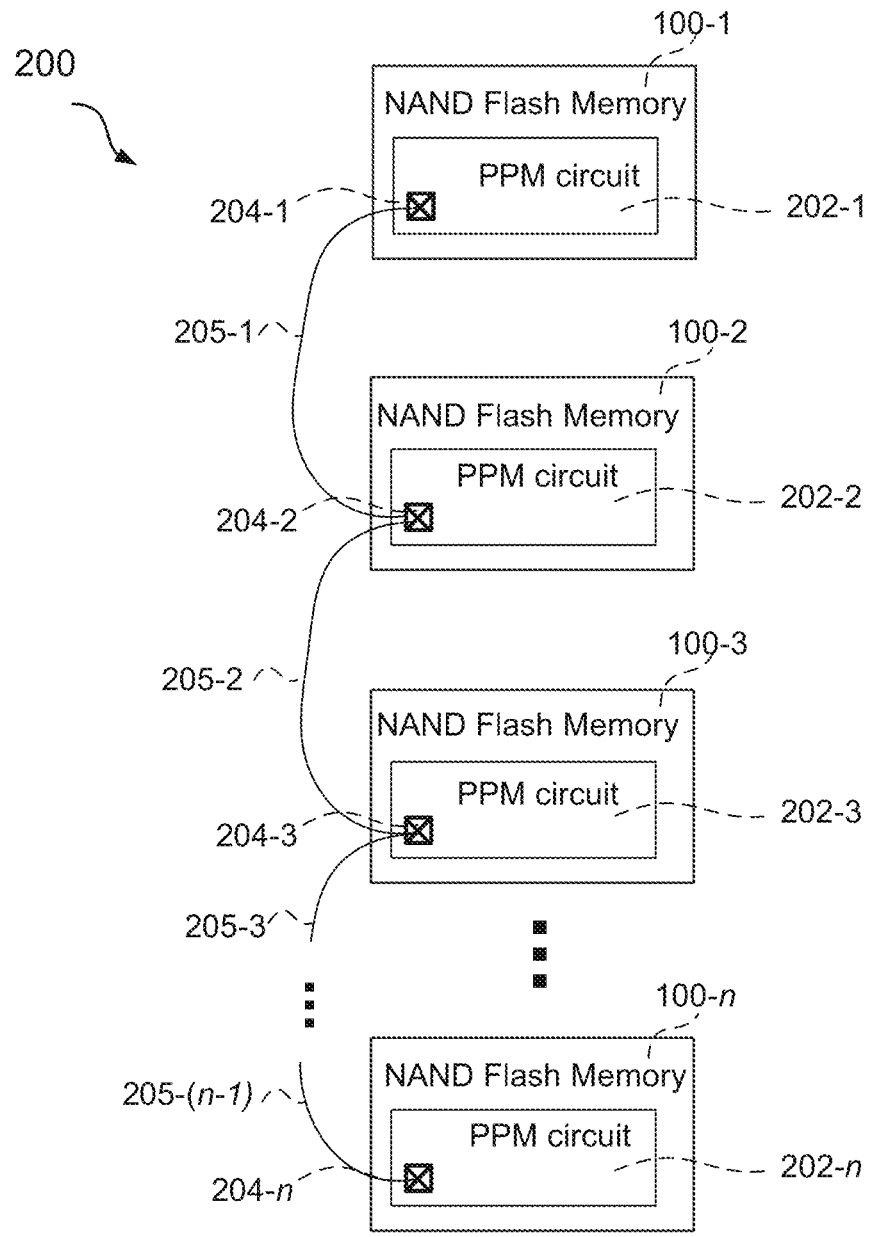
FIG. 2 illustrates a peak power management system in a storage system, according to some embodiments of the present disclosure.

FIG. 2 illustrates a peak power management system 200, according to some embodiments of the present disclosure. The peak power management (PPM) system 200 can be implemented in the storage system 10 in FIG. 1A, where the storage system 10 can include a plurality of memory dies 100-1, 100-2, 100-3, ..., 100-$n$, and each memory die can be similar to the NAND flash memory 100 discussed previously in reference with FIG. 1B. In some embodiments, each NAND flash memory 100 can include at least one peak power management (PPM) circuit 202 where each PPM circuit 202 can include a PPM contact pad 204 (also referred to as PPM pin). The PPM circuits 202-1, 202-2, 202-3, ..., 202-$n$ on different NAND flash memories 100-1, 100-2, 100-3, ..., 100-$n$ of the storage system can communicate with each other through the PPM pins 204-1, 204-2, 204-3, ..., 204-$n$ as a PPM group. In some embodiments, the PPM pins in the same PPM group can be electrically connected with each other between different NAND flash memories 100 through a plurality of die-to-die connections 205. For example, the PPM pin 204-2 on the NAND flash memory 100-2 can be electrically connected with the PPM pin 204-1 on the NAND flash memory 100-1 through the die-to-die connection 205-1 and can be electrically connected with the PPM pin 204-3 on the NAND flash memory 100-3 through the die-to-die connection 205-2. In some embodiments, the die-to-die connections 205 can be a metal wire formed through wire-bonding. In some embodiments, the die-to-die connections 205 can be metal wires or any suitable metal or conductive material formed through flip-chip bonding or any suitable die-to-die bonding. In some embodiments, the die-to-die connections 205 can be formed by through-silicon VIAs (e.g, through-array structures).

By using the die-to-die connections described above, communications between different memory dies (i.e., NAND flash memories 100-1, 100-2, 100-3, ..., 100-$n$) can be established in the storage system. As such, the storage system 10 can send operation commands to any number of memory dies at any time while the PPM circuits 202 can control the system's power consumption by selecting one or more memory dies.

Figure 3:
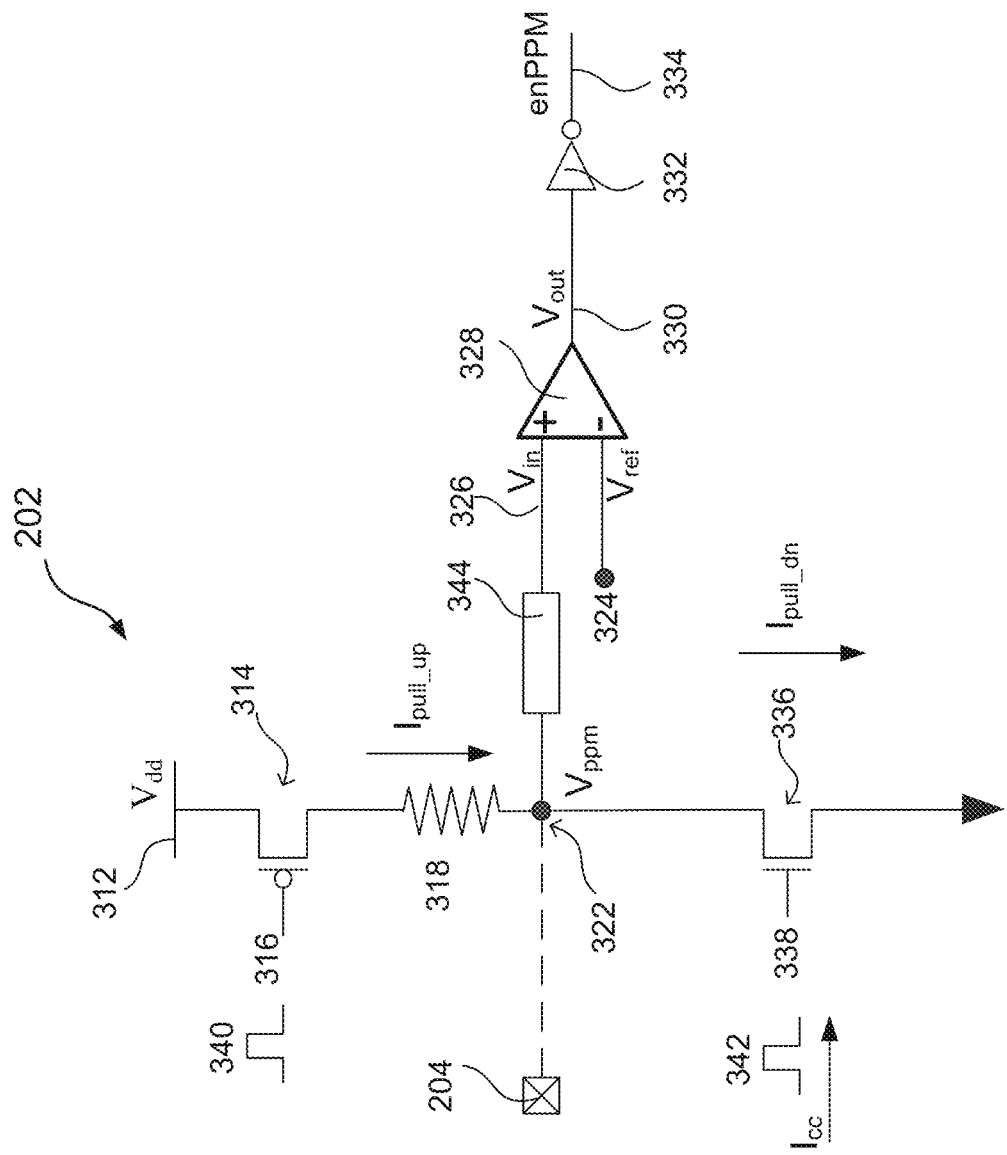
FIG. 3 illustrates a peak power management circuit, according to some embodiments of the present disclosure.

FIG. 3 illustrates an exemplary PPM circuit 202 on the NAND flash memory 100, according to some embodiments of the present disclosure. The PPM circuit 202 can include a pull-up driver 314, where one terminal of the pull-up driver 314 is connected to a power source 312 with a voltage $V_{dd}$. In some embodiments, the pull-up driver 314 can be a metal-oxide-semiconductor-field-effect-transistor (MOSFET). In some embodiments, the pull-up driver 314 can be a p-channel MOSFET (i.e., pFET), where a source terminal of the pFET 314 can be connected to the power source 312 and a drain terminal of the pFET 314 can be connected to a PPM resistor 318 with a resistance $R_{ppm}$.

In some embodiments, the PPM circuit 202 also includes a pull-down driver 336. In some embodiments, the pull-down driver 336 can be a MOSFET. In some embodiments, the pull-down driver 336 can be an n-channel MOSFET (i.e., nFET). A source terminal of the nFET 336 can be grounded, and a drain terminal of the nFET 336 can be connected to the PPM resistor 318.

In some embodiments, the PPM resistor 318 and the drain terminal of the nFET 336 are also electrically connected to the PPM contact pad 204 at a node 322. All the PPM contact pads (e.g., the PPM pins 204) in the same PPM group can be electrically connected through the die-to-die connections 205 (see FIG. 2). Thus, the PPM contact pads 204 of the same PPM group can be held to an electrical potential $V_{ppm}$ at the node 322.

In some embodiments, the PPM circuit 202 can also include a comparator 328, with a first input terminal 324 at a reference voltage $V_{ref}$ and a second input terminal 326 connected to the node 322. The comparator 328 can be an operational amplifier used for comparing an input voltage $V_{in}$ at the second input terminal 326 with the reference voltage $V_{ref}$ at the first input terminal 324, where an output voltage $V_{out}$ at an output terminal 330 can indicate whether the input voltage $V_{in}$ is above or below the reference voltage $V_{ref}$. For example, the output voltage $V_{out}$ can be a positive voltage when the input voltage $V_{in}$ is larger than the reference voltage $V_{ref}$. On the other hand, the output voltage $V_{out}$ can be a negative voltage when the input voltage Vim is smaller than the reference voltage $V_{ref}$.

In some embodiments, the PPM circuit 202 can further include an inverter 332 with an input terminal connected to the output terminal 330 of the comparator 328. The inverter 332 can invert an input signal. For example, when the output voltage $V_{out}$ of the comparator 328 is a positive voltage, a PPM enablement signal enPPM generated by the inverter 332 at an output terminal 334 can be zero, i.e., the PPM enablement signal enPPM can be logic zero. On the other hand, when the output voltage $V_{out}$ of the comparator 328 is a negative voltage, the PPM enablement signal enPPM can be logic 1. In the other words, when the electrical potential $V_{ppm}$ at the node 322 is larger (or higher) than the reference voltage $V_{ref}$ (i.e., $V_{ppm}>V_{ref}$), the PPM enablement signal enPPM=0. When the electrical potential $V_{ppm}$ at the node 322 is smaller (or lower) than the reference voltage $V_{ref}$ (i.e., $V_{ppm}<V_{ref}$), the PPM enablement signal enPPM=1.

In some embodiments, there can be an optional resistance/capacitance (RC) filter 344 connected between the node 322 and the second input terminal 326 of the comparator 328. The RC filter 344 can be used to filter out unwanted signals within a certain frequency range.

As discussed previously, the PPM pins can be electrically connected, i.e., all the PPM pins of the same PPM group have the same electrical potential $V_{ppm}$. In some embodiment, the same PPM group can include one comparator 328 that is electrically connected at the node 322 to the PPM contact pads 204. And the PPM enablement signal enPPM indicates the electrical potential $V_{ppm}$ for the multiple memory dies.

Referring to FIG. 3, during operation, a first control signal 340 can be sent to a gate terminal 316 of the pFET 314 to switch the pFET 314 on or off. For example, if the first control signal 340 has a voltage less than a threshold voltage of the pFET 314, the pFET 314 can be switched on, and a conductive path can be formed from the power source 312 to the PPM resistor 318. The current flowing through the pull-up driver 314 and the PPM resistor 318 is also referred to as a pull-up current $I_{pull\_up}$. If the first control signal 340 has a voltage higher than the threshold voltage of the pFET 314, the pFET 314 can be switched off.

When a second control signal 342 is sent to a gate terminal 338 of the nFET 336, the nFET 336 can be switched on or off. For example, if the second control signal 342 has a voltage higher than a threshold voltage of the nFET 336, the nFET 336 can be switched on, and a conductive path can be formed from the node 322 to the ground. If the second control signal 342 has a voltage less than the threshold voltage of the nFET 336, the nFET 336 can be switched off.

In some embodiments, the pull-down driver 336 can be operated as a current controller. In this example, when the pull-down driver 336 is switched on, the magnitude of the current flowing through the pull-down driver 336 from the node 322 to the ground (also referred to as pull-down current $I_{pull\_dn}$) depends on the second control signal 342. When the pull-down driver 336 is an nFET, as shown in FIG. 3, the pull-down current $I_{pull\_dn}$ can be determined by the voltage level of the second control signal 342 and the trans-conductance of the nFET 336. According to some embodiments of the present disclosure, a current profile $I_{cc}$ of a memory die (e.g., the NAND flash memory 100-1) can correspond to the voltage level of the second control signal 342, and thereby correspond to the pull-down current $I_{pull\_dn}$. Therefore, the pull-down current $I_{pull\_dn}$ can function as a current mirror of the current profile $I_{cc}$ of the memory die.

In some embodiments, the pull-down current $I_{pull\_dn}$ can be proportional to a current level of the current profile $I_{cc}$. The pull-down current $I_{pull\_dn}$ an can be scaled down proportionally from the current level of the current profile $I_{cc}$. For example, if the memory die is operating with 200 mA of current, the pull-down current $I_{pull\_dn}$ of the PPM circuit 202 can be 200 μA. Therefore, memory operations and corresponding current can be monitored and regulated for each memory die through the pull-down current $I_{pull\_dn}$. Furthermore, through the die-to-die connections at the PPM contact pads, peak power operations throughout the entire storage system can be coordinated between different memory dies.

Figure 4:
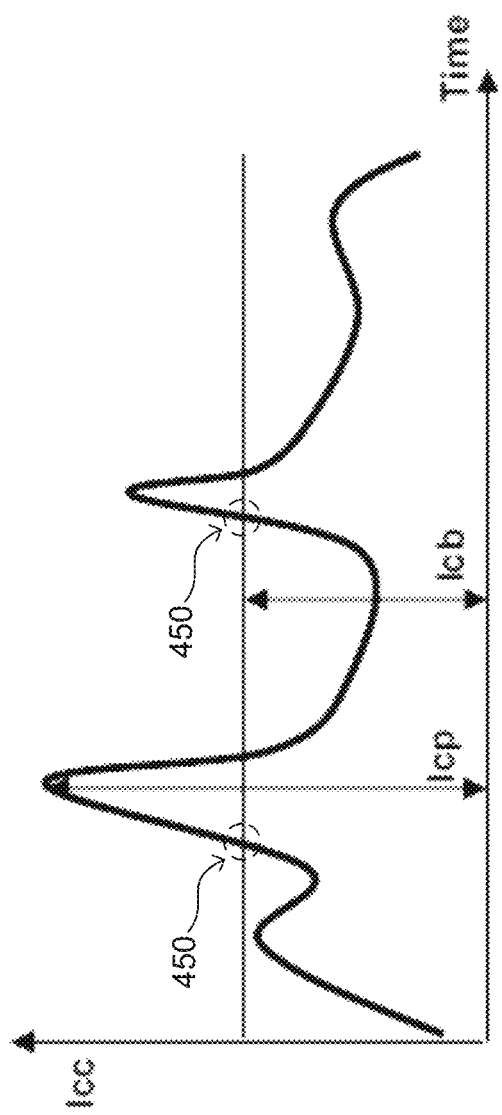
FIG. 4 illustrates a current profile of a memory die, according to some embodiments of the present disclosure.

FIG. 4 shows an exemplary current profile $I_{cc}$ of a memory die (e.g., the NAND flash memory 100 in FIG. 2), according to some embodiments of the present disclosure. The current profile $I_{cc}$ can include two defined current levels, a peak current $I_{cp}$ and a base current $I_{cb}$. The peak current $I_{cp}$ corresponds to a current level when the memory die is performing a peak power operation. The base current $I_{cb}$ corresponds to an average current level when the memory die is performing regular operations. When the current profile $I_{cc}$ of a memory die rises to the base current $I_{cb}$, the memory die arrives at a break point 450. Due to an increasing trend of current, a PPM scheme can be implemented to control total current consumed by the storage system among the multiple memory dies.

Referring back to FIG. 3, in some embodiments, the pull-down current $I_{pull\_dn}$ can also be defined using two current levels, i.e., a high current level $I_H$ (or a first current level) and a low current level $I_L$ (or a second current level). The high current level $I_H$ of the pull-down current $I_{pull\_dn}$ corresponds to the peak current $I_{cp}$ of a specific memory die. The low current level $I_L$ of the pull-down current $I_{pull\_dn}$ corresponds to the base current $I_{cb}$ of the specific memory die.

During operation, according to some embodiments of the present disclosure, only one pull-up driver 314 can be switched on (i.e., enabled) in a PPM group and the other pull-up drivers 314 on different memory dies of the same PPM group can be switched off. As such, current only flows from the power source 312 through one PPM resistor 318 in each PPM group. Namely, the PPM circuits 202 in the same PPM group share a shared pull-up driver 314 and a shared PPM resistor 318.

During operation, the pull-down driver 336 can be switched on or off depending on the status of the memory die, and can be independently controlled according to the PPM management scheme discussed below. For example, the NAND flash memory 100-1 (in FIG. 2) can perform a peak power operation using the peak current $I_{cp}$ when the pull-down driver 336 of the PPM circuit 202-1 is switched on, where a conductive path can be formed through the pull-down driver 336 to the ground with the pull-down current $I_{pull\_dn}$ at the high current level $I_H$. The NAND flash memories 100-1 is prohibited from performing any peak power operation when the pull-down driver 336 of the PPM circuit 202-1 is switched off, where no current can flow through the pull-down driver 336 on the NAND flash memory 100-1.

The electric potential $V_{ppm}$ of the node 322 (or the PPM pins 204) depends on the number of pull-down drivers 336 that are switched on and depends on current levels of the pull-down current $I_{pull\_dn}$ going through the pull-down drivers 336. A peak power operation can be performed on a memory die when the pull-down driver 336 is switched on and the pull-down current $I_{pull\_dn}$ is at the high current level $I_H$. By monitoring the electric potential $V_{ppm}$, a total current $I_{total}$ used by the storage system can be controlled and the number of peak power operations performed in a storage system having multiple memory dies can thereby be regulated.

Figure 5:
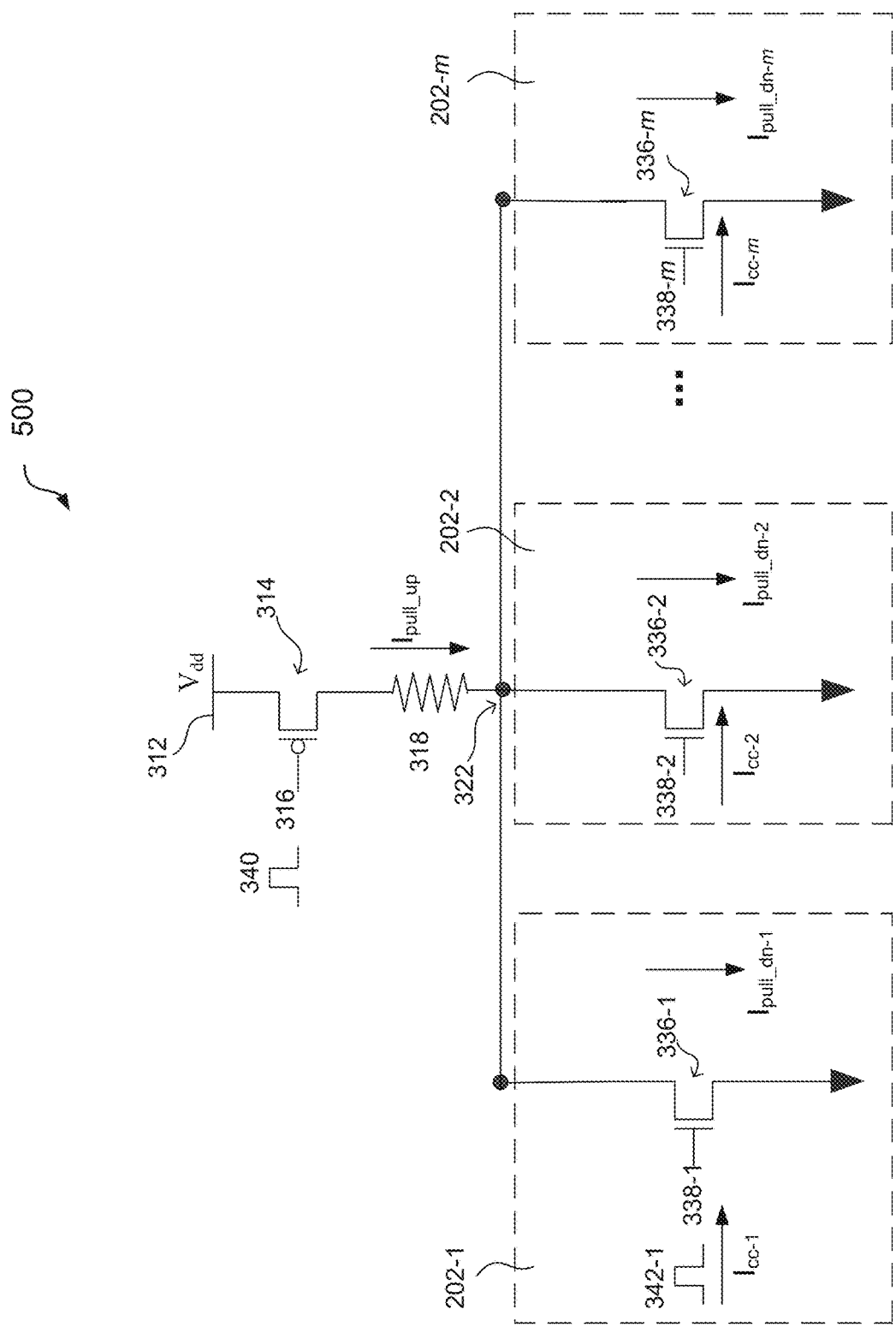
FIG. 5 illustrates a circuit of a peak power management group, according to some embodiments of the present disclosure.

FIG. 5 shows an equivalent PPM circuit 500 in a storage system of multiple memory dies, according to some embodiments of the present disclosure. The equivalent PPM circuit 500 represents the PPM circuits 202 across different memory dies, as shown in FIGS. 2 and 3. Since only the pull-up driver 314 and the pull-down drivers 336 that are switched on can form conductive paths, FIG. 5 omits those pull-up drivers 314 and pull-down drivers 336 that are switched off. As discussed previously, the node 322 is electrically connected to the PPM pin 204 on the memory die (see FIG. 3), and all the PPM pins 204 in the same PPM group are electrically connected between different memory dies (see FIG. 2). Therefore, the node 322 can be held at the same electrical potential $V_{ppm}$ between different memory dies in the same PPM group, and is illustrated as one intersection point to the PPM resistor 318 in FIG. 5.

In some embodiments, only one pull-up driver 314 can be switched on for peak power management across multiple memory dies in the same PPM group. In some embodiments, the pull-down driver 336 can be switched on in the PPM circuit corresponding to the memory die performing the peak power operation, i.e., using the peak current $I_{cp}$.

In one example, there can be m number of pull-down drivers 336 that are switched on in a PPM group, where m can be any whole number. The pull-down drivers 336 are from the PPM circuits 202 of the memory dies, e.g., NAND flash memory 100-1, 100-2, . . . , 100-m in FIG. 2. The pull-down drivers 336 are connected in parallel with each other. In this configuration, the pull-up current $I_{pull\_up}$ flowing through the pull-up driver 314 that is switched on, is the sum of the pull-down current $I_{pull-dn}$, and can be expressed as:

$$I_{pull\_up} = \Sigma_{i=1}^{m} I_{pull\_dn-i} \quad (1)$$

where $I_{pull\_dn-1}$, $I_{pull\_dn-2}$, . . . , $I_{pull\_dn-m}$ are the pull-down current flowing through each of the pull-down drivers 336 that are switched on. The pull-down current $I_{pull\_dn}$ can be set at either the high level current $I_H$ or the low level current $I_L$, depending on the operations performed on the specific memory die.

Since the pull-up driver 314 in FIG. 5 is a shared pull-up driver of the PPM circuits in the PPM group of the storage system, the pull-up current $I_{pull\_up}$ can be a total current of the PPM circuits in the same PPM group of the storage system. In some embodiments, the pull-up current $I_{pull\_up}$ can correspond to a total current $I_{total}$ of the storage system. The pull-up current $I_{pull\_up}$ (in Equation 1) and the total current $I_{total}$ of the storage system can follow the same scaling ratio as the pull-down current $I_{pull\_dn}$ (e.g., the high and low current level $I_H$ and $I_L$) of the PPM circuit 202 and the current profile Ice (e.g., the peak and base current $I_{cp}$ and $I_{cb}$) of the storage system. For example, if the total current Lag of a storage system is 1000 mA, the pull-up current $I_{pull\_up}$ of the PPM circuits 202 can be 1000 µA.

The electric potential $V_{ppm}$ of the node 322 can be expressed as:

$$V_{ppm} = V_{dd} - (R_{ppm} \cdot I_{pull\ up}) \quad (2)$$

wherein $R_{ppm}$ is the resistance of the PPM resistor 318, and $V_{dd}$ is the voltage of the power source 312.

As discussed previously, the reference voltage $V_{ref}$ for the comparator 328 (in FIG. 3) can be selected such that the PPM enablement signal enPPM can be set at enPPM=0 when the electric potential $V_{ppm}$ is higher than the reference voltage $V_{ref}$. In this example, the reference voltage $V_{ref}$ can be defined as:

$$V_{ref} = V_{dd} - (R_{ppm} \cdot I_{pull\_up\_max}) \quad (3)$$

where $I_{pull\_up\_max}$ is a maximum pull-up current flowing through the pull-up driver 314 in the PPM circuit 202, corresponding to a maximum total current $I_{total\_max}$ allowed in a storage system. In some embodiments, the maximum pull-up current $I_{pull\_up\_max}$ of the PPM circuits 202 (in FIG. 2) and the maximum total current $I_{total\_max}$ of the storage system can follow the same scaling ratio as the pull-down current $I_{pull\_dn}$ (e.g., the high and low current level $I_H$ and $I_L$) of the PPM circuit 202 and the current profile $I_{cc}$ (e.g., the peak and base current $I_{cp}$ and $I_{cb}$) of the storage system. For example, if the maximum total current $I_{total\_max}$ allowed in a storage system is 1000 mA, the maximum pull-up current $I_{pull\_up\_max}$ of the PPM circuit 202 can be 1000 µA.

In this example, when the pull-up current $I_{pull\_up}$ is not more than the maximum pull-up current $I_{pull\_up\_max}$, based on the Equations (2) and (3), the electric potential $V_{ppm}$ is higher than the reference voltage $V_{ref}$. The PPM enablement signal enPPM can thereby be set at enPPM=0. On the other hand, when the pull-up current $I_{pull\_up}$ is more than the maximum pull-up current $I_{pull\_up\_max}$, the electric potential $V_{ppm}$ is lower than the reference voltage $V_{ref}$. And the PPM enablement signal enPPM can be set at enPPM=1. As such, by regulating the pull-down driver 336 of the PPM circuit 202, the pull-down current $I_{pull\_dn}$ on each memory die can be adjusted. The pull-up current $I_{pull\_up}$ can be regulated accordingly. By comparing the pull-up current $I_{pull\_up}$ that corresponds to the total current $I_{total}$ of the storage system, with the maximum pull-up current $I_{pull\_up\_max}$ that is pre-determined according to the maximum total current $I_{total\_max}$ allowed in the storage system, the PPM enablement signal enPPM can be set at 0 or 1. In the other words, the reference voltage $V_{ref}$ can be programmed to correspond to the maximum total current $I_{total\_max}$ allowed in the storage system. And the PPM enablement signal enPPM can be used to indicate whether there are still current or power budget to run additional peak power operations. For example, if the PPM enablement signal enPPM=0, the maximum pull-up current $I_{pull\_up\_max}$ of the PPM circuit 202 has not been reached, indicating that the maximum total current $I_{total\_max}$ of the storage system has not been reached. The storage system can provide the peak current $I_{cp}$ to at least one of the memory dies, i.e., having enough power (or current) to provide at least one additional memory die to perform peak power operation. On the contrary, when the PPM enablement signal enPPM=1, the maximum pull-up current $I_{pull\_up\_max}$ of the PPM circuit 202 has been reached, indicating that the maximum total current $I_{total\_max}$ of the storage system has been reached. The storage system has reached its power (or current) limit and cannot provide additional peak current $I_{cp}$ to any of the memory dies to perform any additional peak power operation.

Figure 6:
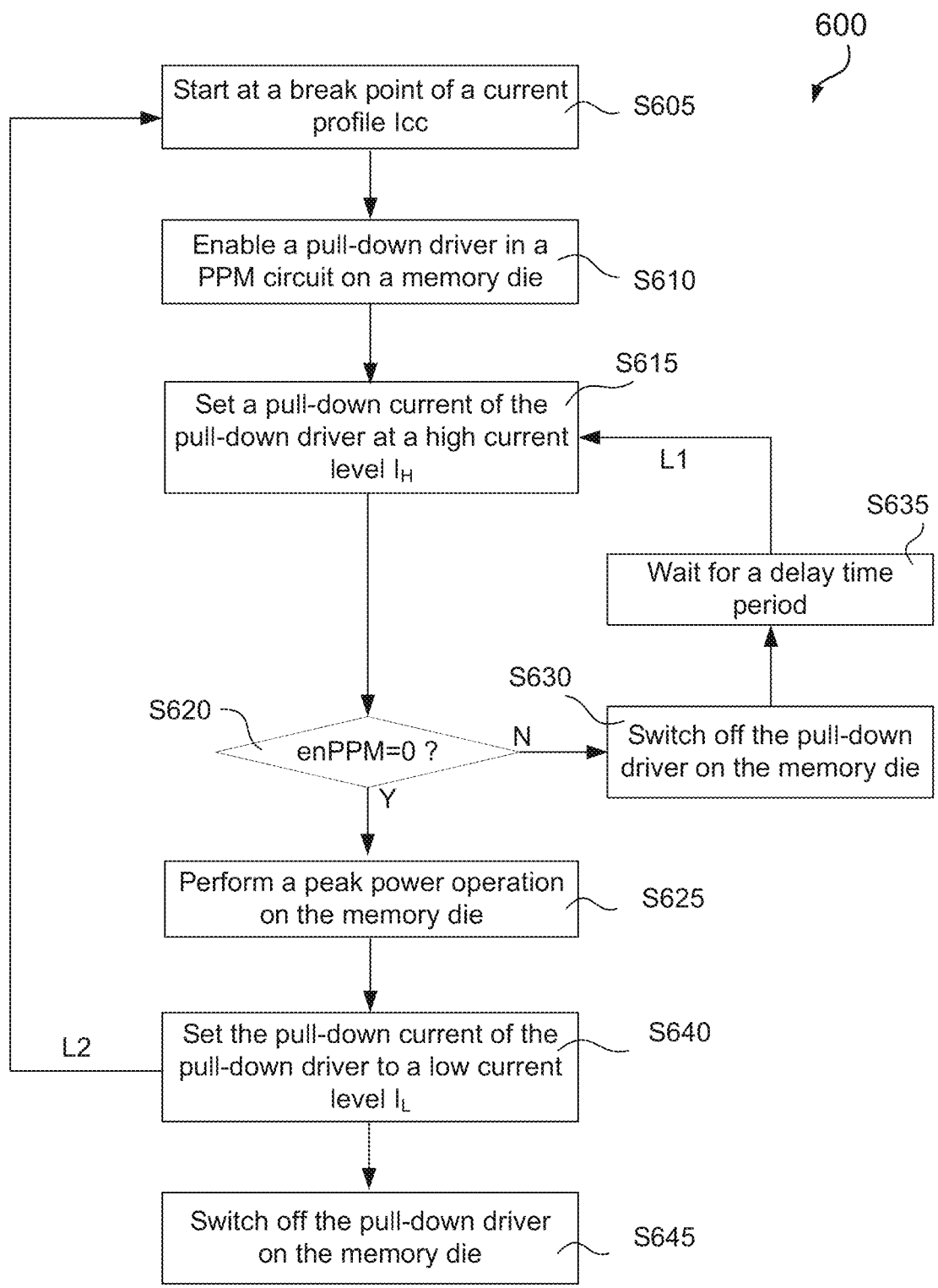
FIG. 6 illustrates a peak power management scheme, according to some embodiments of the present disclosure.

FIG. 6 illustrates a peak power check routine 600 associated with the peak power management system 200 in FIG. 2 and the PPM circuit 202 in FIG. 3, according to some embodiments of the present disclosure. The PPM scheme described with reference with FIGS. 2-5 can be used to determine the reference voltage $V_{ref}$ and generate the PPM enablement signal enPPM to indicate whether the NAND storage system 10 is operating at a current level below the maximum total current $I_{total\_max}$ allowed in the storage system. It should be understood that the peak power check (PPC) routine 600 are not exhaustive and that other operation steps can be performed as well before, after, or between any of the illustrated operation steps. In some embodiments, some operation steps of the PPC routine 600 can be omitted or other operation steps can be included, which are not described here for simplicity. In some embodiments, operation steps of the PPC routine 600 can be performed in a different order and/or vary.

The PPC routine 600 provides an exemplary method of managing peak power usage for a storage system with one or more memory dies, where each memory die includes at least one PPM circuit. The example below is shown for a storage system, e.g., the storage system 10 in FIG. 1A, where each memory die includes the PPM circuit 202 in FIG. 2 for checking and regulating peak power operations performed by the memory dies. However, the method can be extended to a storage system where each memory die includes two or more PPM circuits.

The PPC routine 600 can be implemented before a memory die starts to perform a peak power operation such that the total power (or current) consumed by a storage system can be regulated and controlled to below a predetermined value, e.g., the maximum total current $I_{total\_max}$.

The PPC routine 600 starts at operation step S605, when a NAND storage system (e.g., the storage system 10 in FIG. 1) determines that one of the memory dies (e.g., the NAND flash memory 100-1) in the storage system arrives at a break point (e.g., the break point 450 shown in FIG. 4). Compared with the current level prior to the break point 450, the increased current consumption on the memory die indicates that the memory die may perform a peak power operation subsequently.

Prior to the break point 450, the PPM circuit 202-1 on the NAND flash memory 100-1 can be at a reset state. At the reset state, the pull-down driver 336-1 is switched off. At the operation step S605, one of the pull-up drivers 314 of the PPM circuits 202 can be switched on as a shared pull-up driver among the multiple memory dies in the storage system.

At operation step S610, the pull-down driver 336-1 on the NAND flash memory 100-1 can be switched on.

At operation step S615, the pull-down current $I_{pull\_dn\_1}$ flowing through the pull-down driver 336-1 on the NAND flash memory 100-1 can be set to the high current level $I_H$, which corresponds to the peak current $I_{cp}$ needed to perform the peak power operation on the NAND flash memory 100-1.

At operation step S620, the PPM enablement signal enPPM is verified. If the PPM enablement signal enPPM=0, the pull-up current $I_{pull\_up}$ flowing through the shared pull-up driver is less than the maximum pull-up current $I_{pull\_up\_max}$, indicating that the NAND flash memory 100-1 can perform the peak power operation with the peak current $I_{cp}$ without causing a total current $I_{total}$ of the storage system exceeding the maximum total current $I_{total\_max}$.

At operation step S625, the NAND flash memory 100-1 performs the peak power operation running at the peak current $I_{cp}$. In some embodiments, the NAND flash memory 100-1 can also perform any operation running at a current level less than the peak current $I_{cp}$.

If, at operation step S620, the PPM enablement signal enPPM is not zero (e.g., enPPM=1), the PPC routine 600 continues to operation step S630, where the pull-down driver 336-1 on the NAND flash memory 100-1 can be switched off. At operation step S635, the PPC routine 600 is paused and waits for a delay time period $t_{dl}$. In some embodiment, the delay time period $t_{dl}$ is random. In some embodiments, the delay time period $t_{dl}$ can be any suitable time period in a range between 0.1 μs to 100 μs. In some embodiments, the delay time period $t_{dl}$ can be different for each memory die, i.e., being unique for a specific memory die. After the delay time period $t_{dl}$, the PPC routine 600 returns to operation step S615 via loop L1 and the PPM enablement signal enPPM is checked again.

The delay time period $t_{dl}$ is introduced in event that multiple memory dies enter the PPC routine 600 at the same time and multiple pull-down drivers are switched on and set at the high current level $I_H$ at the same time. If there is no current/power budget available to run the peak power operations for these memory dies at the same time, the PPM enablement signal enPPM indicates to the multiple memory dies at operation step S620. Then the corresponding pull-down drivers can be switched off on the multiple memory dies simultaneously at operations step S630. By introducing the delay time period $t_{dl}$, the multiple memory dies can return to operation step S620 one at a time, i.e., the requests for peak power operations from multiple memory dies can be de-synchronized. As such, the multiple memory dies can perform the peak power operation sequentially without exceeding the maximum total current $I_{total\_max}$ allowed in the storage system.

At operation step S640, after completing the peak power operation, the pull-down current $I_{pull\_dn\_1}$ flowing through the pull-down driver 336-1 can be set to the low current level $I_L$. As such, the NAND flash memory 100-1 can continue operations with current less than the peak current $I_{cp}$.

In some embodiments, the PPC routine 600 can return back via loop L2 to operation step S605, for example, when another break point is detected after the completion of the present peak power operation.

At operation step S645, the pull-down driver 336-1 of the PPM circuit 202-1 on the NAND flash memory 100-1 can be disabled (i.e., switched off), for example, when the current level of the NAND flash memory 100-1 falls below the base current $I_{cb}$. The PPC routine 600 is finished and can be restarted again if the NAND storage system 10 determines that one of the memory dies in the storage system enters one of the break points.

When the pull-down current $I_{pull\_dn}$ an of a specific memory die is set to the high current level $I_H$, the current/power budget can be temporary reserved for this specific memory die. Any other memory die in the same PPM group that runs the PPC routine 600 can be queued in the loop of operation steps S620, S630 and S635 unless the total current $I_{total}$ is less than the maximum total current $I_{total\_max}$ or until the current/power budget is available in the storage system, which can be verified at the operation step S620.

Through defining two current levels (e.g., the peak current $I_{cp}$ and the base current $I_{cb}$) on the current profile $I_{cc}$ of a memory die, and through adjusting the pull-down current $I_{pull\_dn}$ of the pull-down driver 336 in the PPM circuit 202 on the memory die accordingly (e.g., switching on/off, setting to the high current level $I_H$ and the low current level $I_L$), the electric potential $V_{ppm}$ of the PPM contact pads 204 across multiple memory dies in the storage system can be regulated because the PPM contact pads 204 on different memory dies can be electrically connected through the die-to-die connections 205 and can be held at the same electric potential $V_{ppm}$. By comparing the electric potential $V_{ppm}$ with the reference voltage $V_{ref}$ predetermined according to the maximum total current Loral max allowed in the storage system, peak power operations performed by each memory die in the storage system can be managed using the PPC routine 600. As a result, the total current $I_{total}$ of the storage system with multiple memory dies can be controlled.

However, the PPM circuit and PPM scheme are not limited to the examples shown in FIGS. 3-6. Variations of the PPM circuit 202 and the PPC routine 600 can provide similar peak power manage for a storage system with multiple memory dies.

Figure 7:
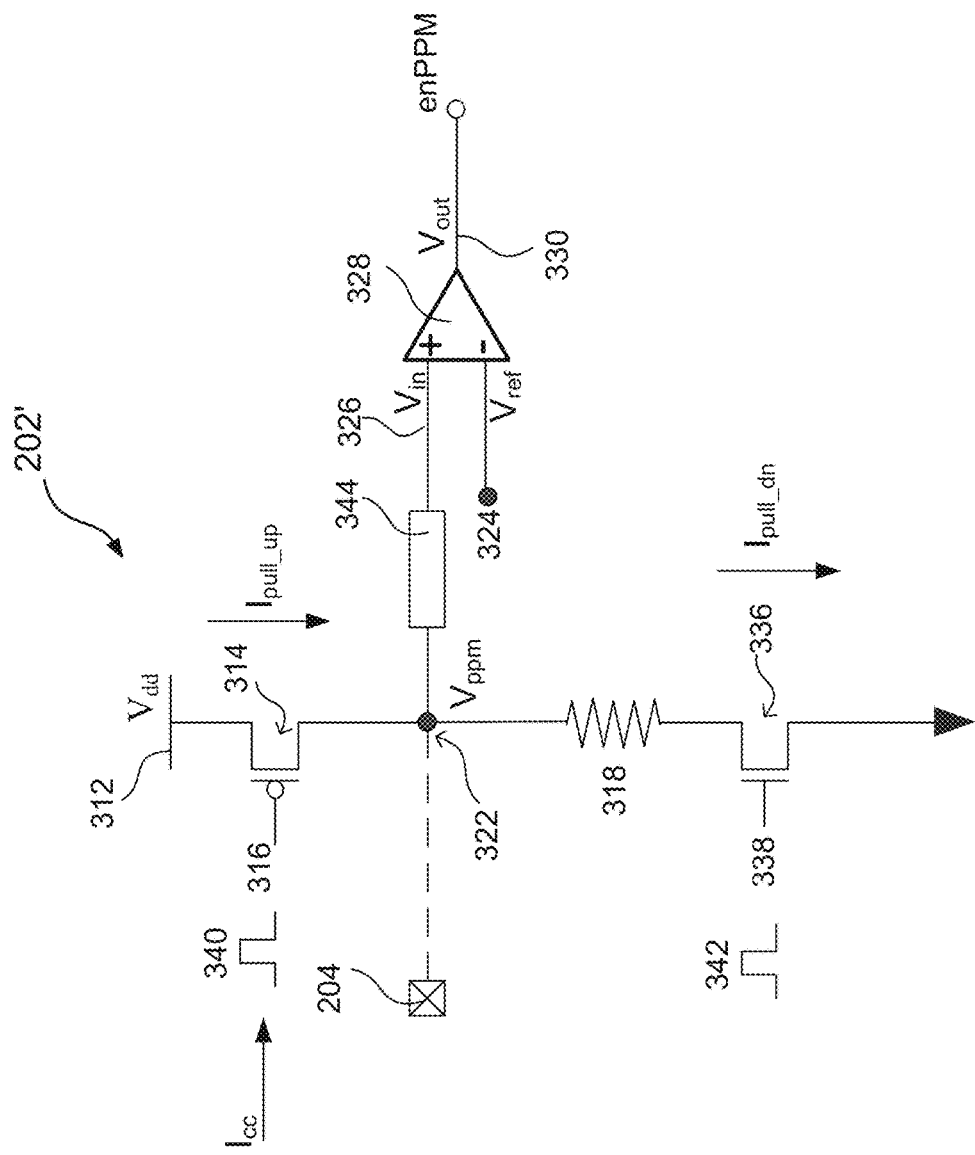
FIG. 7 illustrates another peak power management circuit, according to some embodiments of the present disclosure.

FIG. 7 illustrates another exemplary PPM circuit 202' on the NAND flash memory 100, according to some embodiments of the present disclosure. The PPM circuit 202' is similar to the PPM circuit 202. The main difference is that the PPM resistor 318 can be connected between the node 322 and the pull-down driver 336. In this example, during operation, only one pull-down driver 336 is switched on among the multiple memory dies in the same PPM group, while the pull-up driver 314 can be regulated according to the current profile Ice on the memory die. Here, the pull-up current $I_{pull\_up}$ of the PPM circuit 202' can be defined with two current levels, e.g., the high current level $I_H$ and the low current level $I_L$, corresponding the peak current $I_{cp}$ and the base current $I_{cb}$ of the memory die. In this example, during operation, when there can be m number of pull-up drivers 314 that are switched on in a storage system, the pull-down current $I_{pull\_dn}$ flowing through the pull-down driver 336 that is switched on, is the sum of the pull-up current $I_{pull-up}$, and can be expressed as:

$$I_{pull\_dn} = \Sigma_{i=1}^{m} I_{pull\_up-i} \quad (4)$$

The electric potential $V_{ppm}$ of the node 322 can be expressed as:

$$V_{ppm} = R_{ppm} \cdot I_{pull\_dn} \quad (5)$$

and the reference voltage $V_{ref}$ can be defined as:

$$V_{ref} = R_{ppm} \cdot I_{pull\_dn\_max} \quad (6)$$

where $I_{pull\_dn\_max}$ is a maximum pull-down current flowing through the pull-down driver 336, corresponding to the maximum total current $I_{total\_max}$ allowed in a storage system. Thus, when the pull-down current $I_{pull\_dn}$ is larger than the maximum pull-down current $I_{pull\_dn\_max}$, the electric potential $V_{ppm}$ is higher than the reference voltage $V_{ref}$, and the output voltage $V_{out}$ at the comparator 328 can be positive. In the PPM circuit 202', the output voltage $V_{out}$ can be directly sent to the PPM enablement signal enPPM without an inverter. According, the PPM enablement signal enPPM=1 when $I_{pull\_dn} > I_{pull\_max}$. Conversely, enPPM=0 if $I_{pull\_dn} < I_{pull\_dn}$ max. In this example, PPC routine 600 can be modified by switching the pull-down driver/pull-down current to pull-up driver/pull-up current.

The devices and configurations used for the exemplary PPM circuit 202 in FIG. 3 and the PPM circuit 202' in FIG. 7 are only for illustration purpose and for simplicity to demonstrate the functionality of the PPM circuit and PPM scheme. In some embodiments, the pull-down driver 336 in FIG. 3 can be replaced by a suitable current source to set the current levels of the pull-down current $I_{pull\_dn}$.

Figure 8:
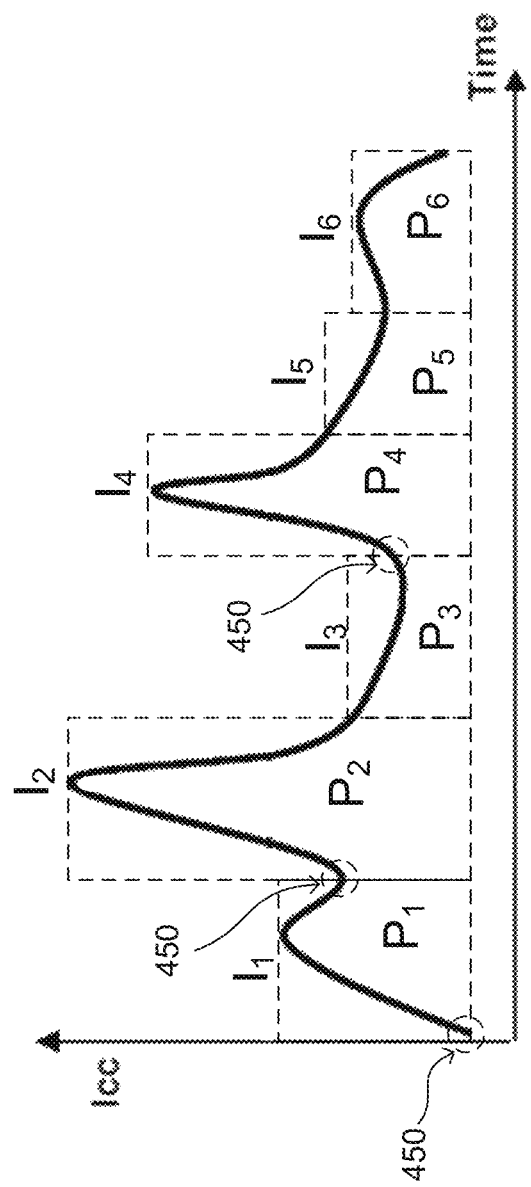
FIG. 8 illustrates a current profile of a memory die, according to some embodiments of the present disclosure.

Dynamic peak power management of a storage system discussed above can also be implemented to closely follow the current profile Ice of a memory die. For example, based on the current profile $I_{cc}$ in FIG. 8, the PPM scheme can be separated into multiple phases, where each phase $P_i$ can include a peak current $I_i$ (i=1, 2, . . . , 6). In this example, when the pull-down driver 336 is switched on, the pull-down current $I_{pull\_dn}$ can be adjusted to be proportional to the peak current $I_i$ of each phase $P_i$. The break point 450 can be inserted at the beginning of phase $P_1$ and each phase $P_i$ if the peak current $I_i$ is larger than the peak current $L_{i-1}$ of the previous phase $P_{i-1}$. For example, break points 450 can be inserted at the beginning of phase $P_1$, $P_2$ and $P_4$ in FIG. 8.

Using similar PPC routine 600 in FIG. 6, when a memory die arrives at a break point 450, for example, at the beginning of phase $P_2$, operation step S605 can be started. The pull-down driver 336 on the memory die can be enabled at operation step S610, and the pull-down current $I_{pull\_dn}$ flowing through the pull-down driver 336 can be set at a current level reflecting the peak current $I_2$ in phase $P_2$. At operation step S620, the PPM enablement signal enPPM is checked. If the PPM enablement signal enPPM=0, the peak power operation corresponding to the peak current $I_2$ can be executed by the memory die. Otherwise, the pull-down driver 336 on the memory die can be switched off and the memory die can wait for a delay time period at operation step S635 before checking the PPM enablement signal enPPM again at operation step S620.

If the peak current $I_i$ is smaller than the peak current $I_{i-1}$ of the previous phase $P_{i-1}$, no break point is needed at the beginning of the phase $P_i$. For example, no break point is inserted in the current profile $I_{cc}$ at the beginning of phase $P_3$ and $P_5$ in the example shown in FIG. 8.

When the peak power operation is completed at operation step S640, the pull-down current $I_{pull\_dn}$ can be adjusted to a lower level to be proportional to the next peak current of the memory die. For example, when the peak power operation is completed for phase $P_2$, the pull-down current $I_{pull\_dn}$ of the memory die can be adjusted to be proportional to the peak current $I_3$ and continues to execute the operations in phase $P_3$.

At the beginning of phase $P_4$, another break point 450 is detected. The PPC routine 600 returns back to operation step S605 and the PPM enablement signal enPPM is checked again at operation step S620.

In summary, the present disclosure provides a peak power management (PPM) system for a storage system with multiple memory dies. The PPM system includes a PPM circuit on each of the multiple memory dies. Each PPM circuit includes a pull-up driver electrically connected to a power source and a PPM resistor; a pull-down driver electrically connected to the PPM resistor; and a PPM contact pad connected to the PPM resistor. PPM contact pads of the multiple memory dies are electrically connected with each other. And the PPM system is configured to manage a peak power operation based on an electric potential of the PPM contact pads.

The present disclosure also provides a method of peak power management (PPM) for a storage system with multiple memory dies, wherein each of the multiple memory dies includes a PPM circuit having a PPM contact pad. PPM contact pads of the multiple memory dies are electrically connected. The PPM method includes the following steps: switching on a pull-down driver of the PPM circuit on a selected memory die of the storage system; verifying a PPM enablement signal regulated by a pull-down current flowing through the pull-down driver; and performing a peak power operation on the selected memory die when the PPM enablement signal indicates that a total current of the storage system is less than a maximum total current allowed for the storage system.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A peak power management (PPM) system for a storage system with multiple memory dies, comprising:
a PPM circuit on each of the multiple memory dies, the PPM circuit comprising a first pull driver, a second pull driver, and a PPM contact pad connected between the first pull driver and the second pull driver, wherein:
PPM contact pads of the multiple memory dies are electrically connected with each other; and
the PPM system is configured to manage peak power operations based on an electric potential of the PPM contact pads, wherein the electric potential of the PPM contact pads is determined according to a first pull current flowing through a certain first pull driver of a certain PPM circuit and the first pull current is a sum of second pull currents flowing through second pull drivers of PPM circuits in the PPM system.

2. The PPM system of claim 1, wherein:
the first pull driver is a pull-up driver electrically connected between a power source and the PPM contact pad; and
the second pull driver is a pull-down driver electrically connected between a ground and the PPM contact pad, wherein the PPM circuit further comprises a PPM resistor electrically connected between the power source and the PPM contact pad and the PPM resistor is in series with the pull-up driver.

3. The PPM system of claim 1, wherein:
the first pull driver is a pull-down driver electrically connected between a ground and the PPM contact pad; and
the second pull driver is a pull-up driver electrically connected between a power source and the PPM contact pad, wherein the PPM circuit further comprises a PPM resistor electrically connected between the ground and the PPM contact pad and the PPM resistor is in series with the pull-down driver.

4. The PPM system of claim 1, wherein the PPM system further comprises a comparator with a first input terminal electrically connected to the PPM contact pads of the multiple memory dies and a second input terminal electrically connected to a reference voltage.

5. The PPM system of claim 4, wherein the reference voltage is based on a maximum total current allowed for the multiple memory dies.

6. The PPM system of claim 1, wherein each of the multiple memory dies comprises a current profile, wherein a current level of the current profile corresponds to a second pull current flowing through a second pull driver of a respective PPM circuit on a respective memory die.

7. The PPM system of claim 6, wherein the second pull current comprises a high current level proportional to a peak current of a peak power operation of the respective memory die.

8. The PPM system of claim 6, wherein the second pull current comprises a low current level proportional to a base current of the respective memory die.

9. The PPM system of claim 6, wherein the second pull driver is a metal-oxide-semiconductor field effect transistor (MOSFET) and the second pull current depends on a gate voltage applied to a gate terminal of the second pull driver.

10. A method of peak power management (PPM) for a storage system with multiple memory dies, wherein each of the multiple memory dies comprises a PPM circuit having a PPM contact pad, and wherein PPM contact pads of the multiple memory dies are electrically connected, the method comprising:
regulating second pull currents flowing through second pull drivers of PPM circuits on the multiple memory dies; and
managing peak power operations of the multiple memory dies according to a first pull current flowing through a certain first pull driver in a certain PPM circuit, wherein the first pull current is a sum of the second pull currents.

11. The method of claim 10, wherein the regulating of the second pull currents comprises regulating a second pull current flowing through a second pull driver of a PPM circuit on a memory die according to a current level of a current profile of the memory die.

12. The method of claim 11, wherein the regulating of the second pull current comprises setting the second pull current at a low current level that is proportional to a base current of the memory die.

13. The method of claim 11, wherein the regulating of the second pull current comprises setting the second pull current at a high current level that is proportional to a peak current of a peak power operation on the memory die.

14. The method of claim 13, wherein the managing of the peak power operations comprises enabling the memory die to perform the peak power operation when the first pull current is no more than a maximum first pull current, wherein the maximum first pull current is proportional to a maximum current allowed for the multiple memory dies.

15. The method of claim 14, further comprising:
switching off the second pull driver of the PPM circuit on the memory die when the first pull current is more than the maximum first pull current.

16. The method of claim 15, further comprising:
after switching off the second pull driver, waiting for a delay time period that is unique to the memory die among the multiple memory dies.

17. The method of claim 14, further comprising:
generating a PPM enablement signal based on an electric potential of the PPM contact pads, wherein the electric potential of the PPM contact pads depends on the first pull current.

18. The method of claim 11, further comprising:
dividing the current profile of the memory die into two or more phases separated by one or more break points, wherein at each of the one or more break points, the current level rises from below to above the base current; and
repeating the regulating of the second pull currents and the managing of the peak power operations for each of the two or more phases.

19. The method of claim 10, wherein the regulating the second pull currents flowing through the second pull drivers comprises regulating pull-down currents flowing through pull-down drivers of the PPM circuits on the multiple memory dies, wherein each of the pull-down drivers is electrically connected between a ground and a respective PPM contact pad of a respective PPM circuit on a respective memory die and each of first pull drivers is a pull-up driver electrically connected between a power source and the respective PPM contact pad.

20. The method of claim 10, wherein the regulating the second pull currents flowing through the second pull drivers comprises regulating pull-up currents flowing through pull-up drivers of the PPM circuits on the multiple memory dies, wherein each of the pull-up drivers is electrically connected between a power source and a respective PPM contact pad of a respective PPM circuit on a respective memory die and each of first pull drivers is a pull-down driver electrically connected between a ground and the respective PPM contact pad.

21. A storage system, comprising:
a memory controller; and
multiple memory dies, wherein each of the multiple memory dies comprises a PPM circuit, each PPM circuit comprising:
a first pull driver;
a second pull driver; and
a PPM contact pad connected between the first pull driver and the second pull driver, wherein:
PPM contact pads of PPM circuits on the multiple memory dies are electrically connected with each other; and
the PPM circuits of the multiple memory dies are configured to manage peak power operations for the multiple memory dies according to a first pull current flowing through a certain first pull driver of a certain PPM circuit, wherein the first pull current is a sum of second pull currents flowing through second pull drivers of the PPM circuits.

* * * * *